United States Patent [19]
Good et al.

[11] Patent Number: 5,933,633
[45] Date of Patent: Aug. 3, 1999

[54] STATE TABLE GENERATING SYSTEM

[76] Inventors: Sebastian Erich Good, 6320 S. Main St., Houston, Tex. 77005; Rick Allan LaPlante, 10323 - 248th Ave. NE., Redmond, Wash. 98053; Patrick Wickline, 103 NW. 70th, Seattle, Wash. 98117

[21] Appl. No.: 08/752,711
[22] Filed: Nov. 19, 1996
[51] Int. Cl.⁶ .................................................. G06F 17/00
[52] U.S. Cl. ........................... 395/701; 395/704; 395/709; 395/183.14; 395/183.13; 395/185.04; 364/488; 371/27.1
[58] Field of Search ...................... 395/701, 702, 395/500, 185.03, 185.04, 704, 709, 183.14, 183.13, 183.08, 572, 581, 580, 595; 364/488–491, 512, 578; 702/108, 119, 123; 371/27.1

[56] References Cited

U.S. PATENT DOCUMENTS

| | | | |
|---|---|---|---|
| 5,371,683 | 12/1994 | Fukazawa et al. | 364/489 |
| 5,426,651 | 6/1995 | Van De Burgt | 371/27.1 |
| 5,537,580 | 7/1996 | Giomi et al. | 395/500 |
| 5,539,680 | 7/1996 | Palnitkar et al. | 364/578 |
| 5,652,714 | 7/1997 | Peterson et al. | 702/57 |
| 5,655,075 | 8/1997 | Saito et al. | 395/185.01 |
| 5,659,554 | 8/1997 | Okayasu | 371/27.1 |
| 5,740,070 | 4/1998 | Nishimoto et al. | 364/490 |
| 5,751,592 | 5/1998 | Takai et al. | 364/488 |

*Primary Examiner*—Emanuel Todd Voeltz
*Assistant Examiner*—Tuan Q. Dam

[57] ABSTRACT

A system for generating a state table and/or state diagram of a target system by defining usage variables in a partition of the target system being explored, exploring each state and state transition in the partition, and generating a state table and/or state diagram that includes a present state and new state for each state transition identified in the partition. A state in the target system is the combination of all usage variable values at a given time during target system operation.

26 Claims, 8 Drawing Sheets

FIG. 7

| PRESENT STATE (OUT OF SCOPE UV'S NOT SHOWN) | STIMULUS | NEW STATE | |
|---|---|---|---|
| STATUS - NOT RUNNING | START CMD | STATUS - RUNNING | 720 |
| STATUS - RUNNING | STOP CMD | STATUS - NOT RUNNING | 721 |
| STATUS - RUNNING; IN A FILE - NO | OPEN FILE | STATUS - RUNNING; IN A FILE - YES | 722 |
| STATUS - RUNNING; IN A FILE - YES | CLOSE FILE | STATUS - RUNNING; IN A FILE - NO | 723 |
| STATUS - RUNNING; IN A FILE - YES | SAVE/SAVE AS 1ST TIME | STATUS - RUNNING; IN A FILE - YES; FILE PREV SAVED - NO | 724 |
| STATUS - RUNNING; IN A FILE - YES; FILE PREV SAVED - NO | CANCEL | STATUS - RUNNING; IN A FILE - YES | 725 |
| STATUS - RUNNING; IN A FILE - YES; FILE PREV SAVED - NO | UNIQUE FILE NAME PROVIDED | STATUS - RUNNING; IN A FILE - YES | 726 |
| STATUS - RUNNING; IN A FILE - YES; FILE PREV SAVED - NO | NON-UNIQUE FILE NAME PROVIDED | STATUS - RUNNING; IN A FILE - YES; FILE PREV SAVED - YES | 727 |
| STATUS - RUNNING; IN A FILE - YES; FILE PREV SAVED - YES | CANCEL | STATUS - RUNNING; IN A FILE - YES | 728 |
| STATUS - RUNNING; IN A FILE - YES; FILE PREV SAVED - YES | OVERWRITE OK | STATUS - RUNNING; IN A FILE - YES | 729 |
| STATUS - RUNNING; IN A FILE - YES | SAVE NTH TIME | STATUS - RUNNING; IN A FILE - YES; FILE PREV SAVED - YES | 730 |
| STATUS - RUNNING; IN A FILE - YES | SAVE AS NTH TIME WITH EXISTING NAME | STATUS - RUNNING; IN A FILE - YES; FILE PREV SAVED - YES | 731 |

FIG. 8

| PRESENT STATE | STIMULUS AVAILABLE FROM PRESENT STATE | |
|---|---|---|
| SYSTEM STATUS - NOT RUNNING | START APPLICATION COMMAND | ~820 |
| SYSTEM STATUS - RUNNING | STOP APPLICATION COMMAND<br>OPEN FILE COMMAND | ~821 |
| SYSTEM STATUS - RUNNING<br>IN A FILE - YES | CLOSE FILE COMMAND<br>SAVE COMMAND<br>SAVE AS COMMAND | ~822 |
| SYSTEM STATUS - RUNNING<br>IN A FILE - YES<br>FILE PREVIOUSLY SAVED - NO | CANCEL COMMAND | ~823 |
| SYSTEM STATUS - RUNNING<br>IN A FILE - YES<br>FILE PREVIOUSLY SAVED - YES | CANCEL COMMAND<br>OVERWRITE VERIFICATION COMMAND | ~824 |

STATE TABLE GENERATING SYSTEM

FIELD OF THE INVENTION

This invention relates to the field of state tables and in particular to a system for automatically generating a state table and/or state diagram that identifies the operational states of a complex system at run time and the stimuli required for a state transition between any two operational states.

PROBLEM

A map of operational states and the stimulus required to transition between operational states is useful and often essential when designing and/or testing a complex system. The map of operational states and the stimuli among the states is known in engineering arts as a state diagram and/or state table. A system that is mapped in terms of a state table in the context of the present discussion can include, but is not limited to, an apparatus, component, application, or process, in the electrical, mechanical, chemical, and or software arts. Mapping the states of a system can be used as a design tool to define a system in terms of the possible operational states and the stimuli required to enter, exit, or remain in each of the operational states. Another use for mapping the states of a system is for use as a test verification tool to verify system operation in terms of the operational state that is expected as the result of specific stimuli.

Historically state tables have been manually generated and manipulated as described above. However, manually generating and/or manipulating a state table, even for a simple system having only 10's of states, is a labor intensive task that is subject to human error at every stage of generation and manipulation. Thus, it is beyond practicality to manually generate and manipulate a state table for a more complex system having on the order of $10^4$ to $10^5$ states because such an undertaking typically requires multiple persons and hundreds of man-hours, and the potential for human error is not eliminated and can even be increased due to the amount of manual labor involved.

For these reasons, it is desirable to have an automated system for generating and/or updating a state table to minimize errors in the state table, maximize repeatability of generating the state table for verification purposes, and dramatically reduce the time required to generate and update the state table. An automated system of this type has heretofore not been known prior to the disclosure herein.

SUMMARY

The state table generating system of the present invention automatically generates a state table based in part on user variable definitions supplied by a state table generating system user and in part by the stimuli that are discoverable and acted on in real time by the state table generating system itself. Setting up the state table generating system includes defining at least one usage variable that is used to define a state of a target system, defining control specifications that define how stimuli operate on the target system, and optionally defining partitioning criteria for the target system. Once setup is complete, the state table generating system operates by exploring the defined partition of the target system and generating a state table of the target system that includes a present state and a next state for each state transition resulting from a given stimulus. Exploring the defined partition includes calculating the values of all usage variables to determine a present state, selecting a stimuli that is available from the present state, and applying the stimuli to discover the next state. Generating the state table includes adding the applied stimuli and the resulting next state to the state table in view of the user defined usage variables.

In one embodiment, the state table generating system records the occurrence of a state transition conflict and continues processing. A transition conflict is a situation where a known stimuli applied from a known present state results in a different next state than for any previous application of the stimuli from the same present state. In another embodiment the state table generating system prompts a state table generating system user for usage variable definition information needed to navigate a transition conflict when one is encountered. In another embodiment the state table generating system queries the target system itself for the information needed to navigate through a transition conflict when one is encountered without operator or user intervention.

BRIEF DESCRIPTION OF THE DRAWINGS

FIG. 7 illustrates a state transition table example based on the FIG. 6 usage variable definition tree;

FIG. 8 illustrates an available stimuli table corresponding to the state transition table of FIG. 7.

DETAILED DESCRIPTION

Figures 1, 2:
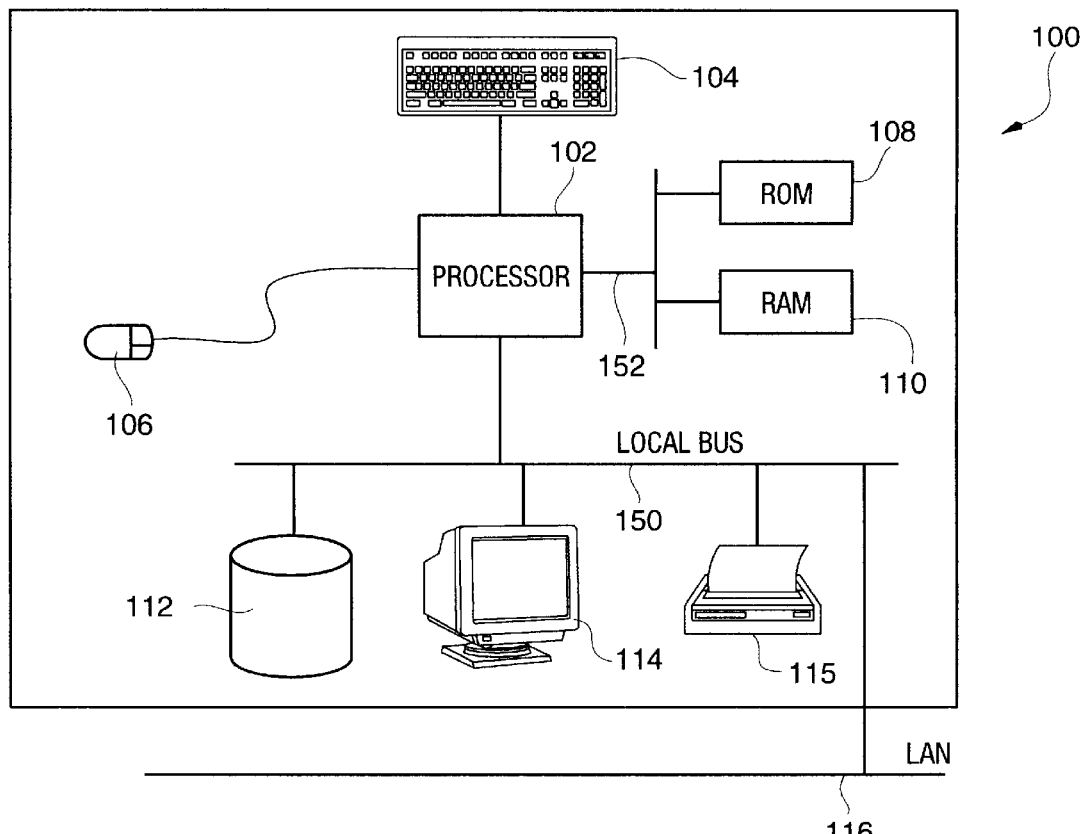
FIG. 1 illustrates a state table generating system computing environment in block diagram form.
FIG. 2 illustrates a state table in table form.

State Table Generating System Computing Environment—FIG. 1

FIG. 1 illustrates a block diagram example of a computer system 100 used in a state table generating system. The state table generating system of the present invention is operable in any of several standard computing systems readily available in the industry. Programmed instructions for the state table generating system are executable on processor 102. Processor 102 stores and/or retrieves the programmed instructions and/or data from memory devices that include, but are not limited to, Random Access Memory (RAM) 110 and Read Only Memory (ROM) 108 by way of memory bus 152. Another accessible memory device includes non-volatile memory device 112 by way of local bus 150. User input to computer system 100 is entered by way of keyboard 104 and/or pointing device 106. Human readable output from computer system 100 is viewed on display 114 or in printed "report" form on local printer 115. Alternatively, computer system 100 is accessible for user input and/or generating human readable displays in printed and/or display screen output form by way of Local Area Network (LAN) 116 in a manner well known in distributed computing and computer network art.

Figure 3:
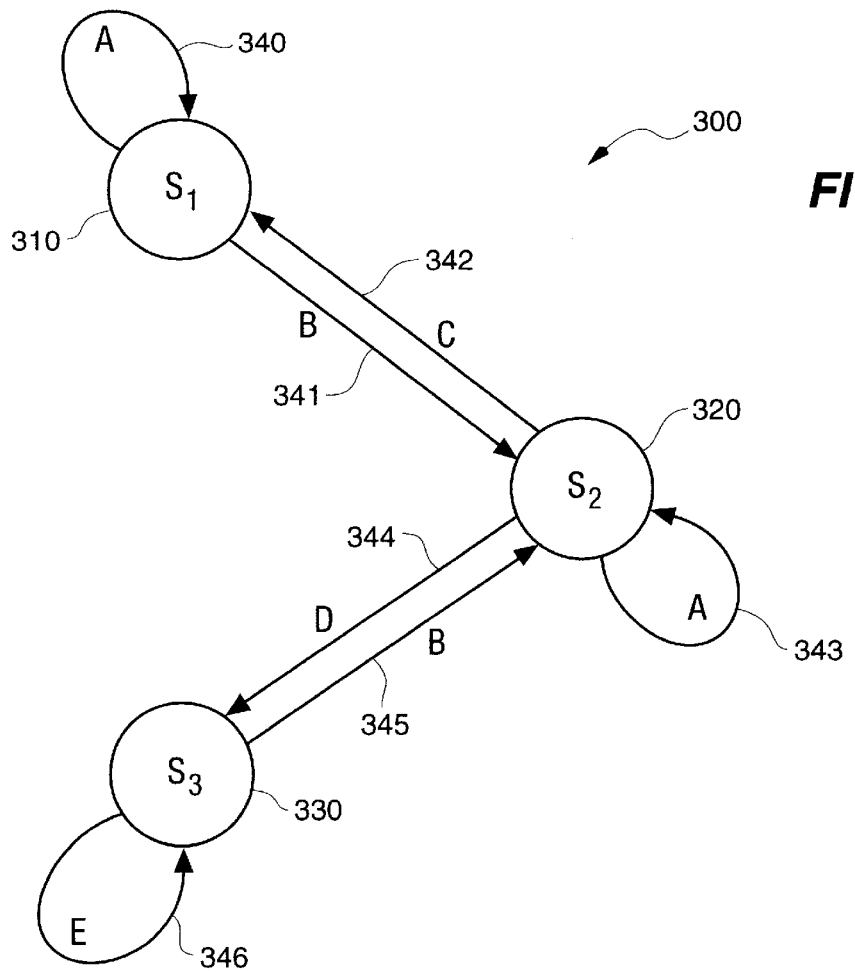
FIG. 3 illustrates a state table in graphic state diagram form.

State Table Display Format—FIGS. 2–3

FIG. 2 illustrates a generic example of a state table 200, also known as a transition table, in table form. State table 200 includes a present state 210, a stimulus 220 also known as an action or event depending on the context of the process or device being mapped, and a new state 230 that is the result of stimulus 220. For example, in state table row 240, if stimulus A occurs when the target system is in present state S1 then the target system will remain in state S1. However, as illustrated in state table row 241, if stimulus B occurs when the target system is in present state S1 then the target system will transition to a new state S2. The remaining state table rows 242–246 illustrate additional transitions from a present state 210 to a new state 230 as the result of a given stimulus 220. Note that although the same stimulus "A" operates on states S1 and S2 in state table rows 240 and 243 respectively, and stimulus "B" operates on states S1 and S3 in state table rows 241 and 245 respectively, the respective stimuli do not necessarily produce the same transition result from when operating on different states as is more apparent in FIG. 3 below.

FIG. 3 illustrates the state table 200 of FIG. 2 in the graphic form of state diagram 300 also known as a directed graph. State diagram 300 contains the same present state 210, new state 230, and stimulus 220 information of state table 200, although the information is presented in a more pictorially graphic form. Circles S1 310, S2 320, and S3 330 represent the operational states of a target system. The lines 340–346 represent individual stimuli and the direction of state transition due to each stimuli based on the directional arrow associated with each line 340–346. For example, from present state S1 at 310, the occurrence of stimuli 340 results in a transition back to state S1 at 310. However, from present state S1 at 310, the occurrence of stimuli 341 results in a transition to new state S2 at 320. The remaining stimuli 342–346 illustrate additional transitions from any one of the states 310–330 to itself or to any other state 310–330. Thus, the relationship between states 310–330 is easier to comprehend when viewing the state diagram 300.

Figure 4:
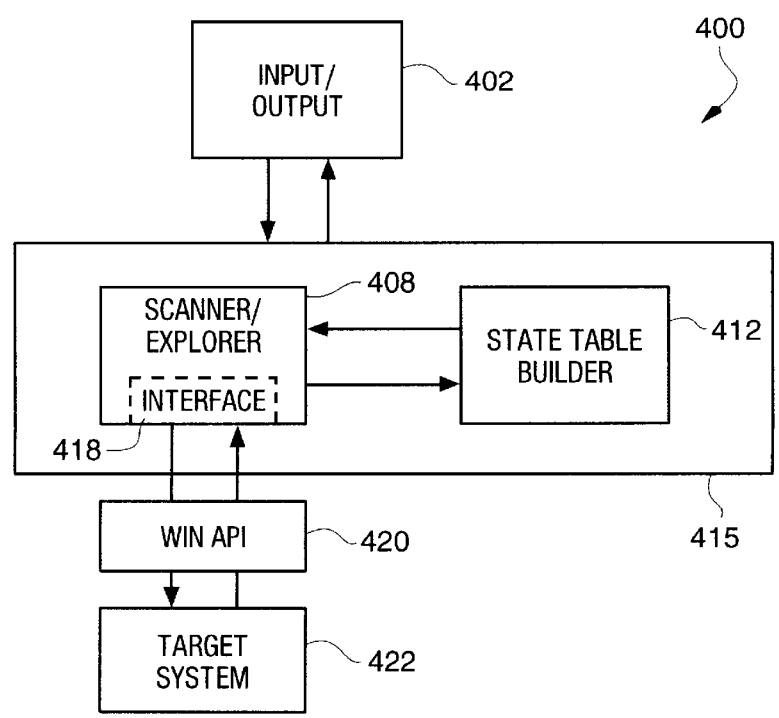
FIG. 4 illustrates operational components of the state table generating system in block diagram form.

Operational Components—FIG. 4

FIG. 4 illustrates the operational components and/or processes 400 of the state table generating system in block diagram form. The primary state table generating system component 415 includes a scanner/explorer component 408, and a state table builder component 412. User input to and/or output from the state table generating system is facilitated by the user input/output component 402 that is operatively connected either directly or indirectly to the primary state table generating system component 415. User input/output can include, but is not limited to, real time input from a human operator, real time output on a display screen, and input/output from and to another program. Target system 422 is operatively connected through the Windows Application Program Interface (API), or other functionally similar interface, 420 to the scanner/explorer 408 by a communication interface 418. The communication interface 418 facilitates either direct or indirect communication therebetween target system 422 and the primary state table generating system 415.

A target system 422 that is software based can either share the same computing environment 100 as the primary state table generating system component 415 or reside on a remote processor that is communicatively accessible by the primary state table generating system component 415 by way of a LAN 116 or other remote access communication interface 418. A target system 422 that is hardware based can be scanned and/or explored by the scanner/explorer component 408 of the primary state table generating system component 415, by way of communication interface 418 that is operatively connected to the relevant leads of an electrical system or electro-mechanical system.

Figure 5:
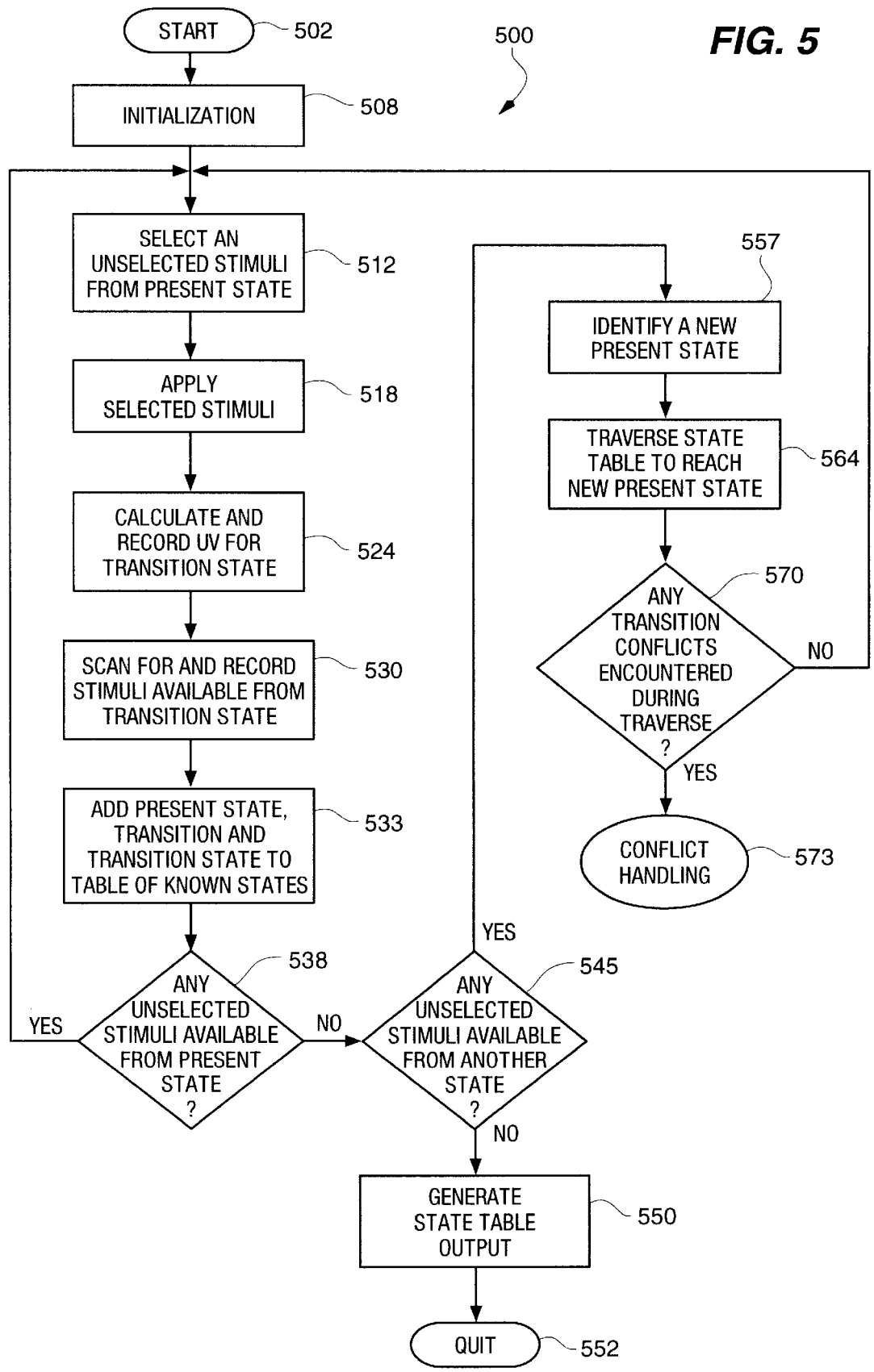
FIG. 5 illustrates an overview of the state table generating system operational steps in flow diagram form.

Operationally, scanner/explorer component 408 is the component that probes target system 422 to identify the actual states and their transition stimuli between each state of the target system 422 as disclosed in the text accompanying FIG. 5. State table builder component 412 is the component that collects the state and transition stimuli information from the scanner/explorer component 408 to construct a state table and/or graphic state diagram of the target system 422 for saving on a memory medium and/or output to the user by way of input/output component 402.

Operational Steps—FIG. 5

FIG. 5 illustrates the operational steps 500 for the state table generating system. The operational steps 500 begin at step 502 and proceed to system initialization at step 508. System initialization includes, but is not limited to, defining usage variables, defining system controls and commands, and optionally defining partitions. Additionally, the process is seeded with a startup state and stimuli associated with the startup state. The initialization definitions can be generated each time prior to running the state table generating system. Alternatively, one or more sets of initialization definitions can be generated prior to running the state table generating system and then stored for future use in separate initialization files readable from a non-volatile memory medium. Initialization definitions include, but are not limited to, target system definitions and hardware processing system definitions.

Usage variables are central to the state table generating system's ability to identify a state in the target system because a present state is the unique combination of all usage variable values. For example, one usage variable common to most systems is the System Status usage variable that can have values including, but not limited to, system Running and system Not Running. Thus the System Status usage variable by itself defines two fundamental states of the target system that are joined by stimuli such as the Start Target System command and the Stop Target System command.

To manually define a usage variable, a human user can supply the state table generating system with a statement having syntax in effect similar to the following:

UV"uvname"(value1:"value1 name"=detection code1, . . . valueN:"valueN name"=detection codeN)

where uvname represents a unique name of the usage variable being defined, value1 through valueN represent the values associated with the usage variable, and detection code1 through detection codeN represent computer codes used to determine if a given value is set. At least one usage variable of the above type example is provided as input to the state table generating system by way of direct real-time user entry or an identified file containing the usage variable definitions. Note that the state table generating system will function properly in the absence of a complete set of usage variable definitions, however, certain states will be missing from the final state table as a result. In the last case it is important to define usage variables that provide state transition conflict resolving information that would otherwise be unknown to the state table generating system and potentially block the system's ability to proceed with generating a complete or accurate state table. A state transition conflict is a situation where the state table generating system encounters one state resulting from a stimuli in one instance and a completely unexpected state in response to the same stimuli from the same starting state in another instance.

Although defining usage variables is necessary to seed the state table generating system with the information needed to define individual states, alternative embodiments exist that require less or at least different levels of human intervention. In one alternative embodiment, key usage variable definitions may need to be provided by a human user at the time a state transition conflict is encountered. That is, when such a transition conflict is encountered, the state table generating system can either record the conflict and continue processing, and/or pause to notify the operator that a transition conflict has been identified and that additional information is required to resolve the conflict.

In another alternative embodiment, the state table generating system can explore a target system in multiple passes and use artificial intelligence techniques and/or target system provided accessibility methods to obtain its own usage variable values without human intervention. Accessibility methods include, but are not limited to, windows into the internal architecture and/or data structures of the target system that allow an independent process such as the state table generating system to extract data and/or monitor changes in internal data known to the target system that provide insight as to why the state transition is different given the same stimulus as a previous pass by the state table generating system. For example, in a first exploration pass through the target system, the state table generating system would map all transitions including each transition conflict instance. In at least one subsequent pass the state table generating system retraces its first pass steps while monitoring data available by way of accessibility methods to identify the usage variable differences that are the cause of the alternative state transitions based on the same stimuli from a previous pass. If the state table generating system is unable to identify the cause of the transition conflict from the information available by way of the accessibility methods provided by the target system, then the necessary information can be requested from the state table generating system user as previously described.

Defining a partition is an optional initialization exercise. The purpose of partitioning is to limit the complexity of the resulting state table or state diagram by limiting what parts of the target system the state table generating system explores. Using partitioning criteria also facilitates generating an updated state table for only the part of a target system that has been modified or recently added.

Proceeding on the assumption that usage variable definitions are available to the state table generating system, the state table generating system begins processing at step 512 where an unselected stimuli is selected from the set of stimuli that are available from the present state. Initially, the seeded startup stimuli are used the first time through the process. The selected stimuli is applied at step 518 and the state transition is monitored to determine the next state, also known as the transition state, that results from applying the selected stimuli.

The UV values for the transition state are calculated and recorded at step 524. The UV's for the transition state uniquely identify the transition state from any other state previously known. The stimuli available from the transition state are scanned for and recorded at step 530. Available stimuli can include, but is not limited to, user accessible interface commands, system internal commands, and other discrete actions from a given state. The available stimuli from each encountered state is recorded so that the state table generating system can keep track of which stimuli from which state have been applied and which stimuli have not yet been applied. Tracking the available or not yet attempted stimuli from a given state helps to facilitate determining, for example, where to proceed for further state table processing at decision steps 538 and 545.

At step 533, the present state from which the selected stimuli was applied, the transition resulting from the applied stimuli, and the resulting transition state, are all added to the table of known states. If at decision step 538 it is determined that there are additional and yet unselected stimuli from the present state, processing continues at step 512 as previously disclosed. If at decision step 538 it is determined that there are no additional unselected stimuli from the present state, then processing continues at decision step 545.

If at decision step 545 it is determined that there are no additional unselected stimuli available from any other known state in the state table, then processing continues to step 550 where state table output is generated and the process ends at step 552. Alternatively, if at decision step 545 it is determined that there are unselected stimuli available from at least one other state in the state table, then processing continues at step 557.

At step 557 one of the at least one other states having unselected stimuli available is identified for further processing. At step 564 the known states for the target application are traversed, for example after restarting the target application to begin the "known state" traversal from a predetermined starting point, until the state identified in step 564 is located. Traversing the state table to reach the state identified in step 564 is important because the processing context or other operational situation must be properly reconstructed so that the unselected stimuli available from the identified state makes operational sense when the stimuli is applied. Because the state table generating system is automated, restarting the target application and traversing the target system's known states does not present a significant processing overhead concern.

If at decision step 570 it is determined that a transition conflict has been encountered while traversing the known states, the processing continues to step 573 for transition conflict handling. A transition conflict can be handled in any one of numerous manners as previously disclosed including, but not limited to, recording that the conflict occurred and proceeding with processing, notifying an operator that a conflict has occurred and awaiting operator intervention, or resolving the conflict by monitoring internal target system data. If at decision step 570 it is determined that a transition conflict has not been encountered during traversal, then processing continues at step 512 with a new present state as previously disclosed.

Note that the operational steps 500 illustrate a preferred embodiment that applies all stimuli from a given state before selecting a subsequent state from which all available stimuli are applied, even if the subsequent state can not be operationally exercised without restarting and traversing some portion of the target system. Alternatively, it is within the scope of the claimed invention to modify operational steps 500 in a manner that, for example, follows the transition chain of states from present state to next state as each available stimuli is selected and applied. When a previously recorded state is encountered and the previously recorded state does not have any unselected stimuli available for selection, then any state having unselected stimuli available can be selected as previously disclosed in the text accompanying steps 545–573.

State Table Generating Example—FIGS. 6–9

One use of the state table generating system is to map the states and transitions between states for the Application Program Interface (API) or User Interface (UI) of a word processing application target system. The following discussion illustrates the operational steps 500 of the state table generating system relative to the UI of a word processing application target system.

Figure 6:
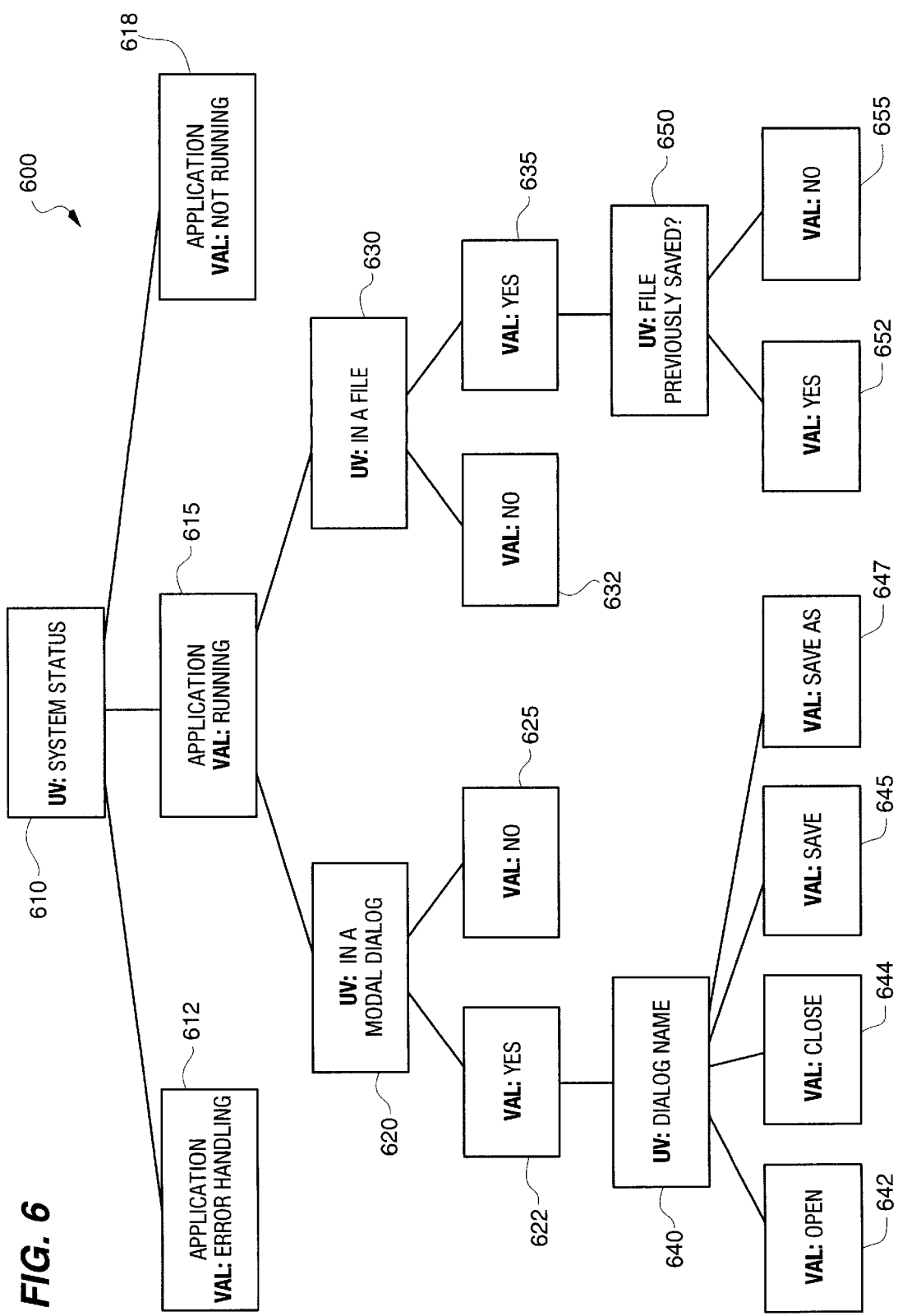
FIG. 6 illustrates a usage variable definition tree example.
Figure 9:
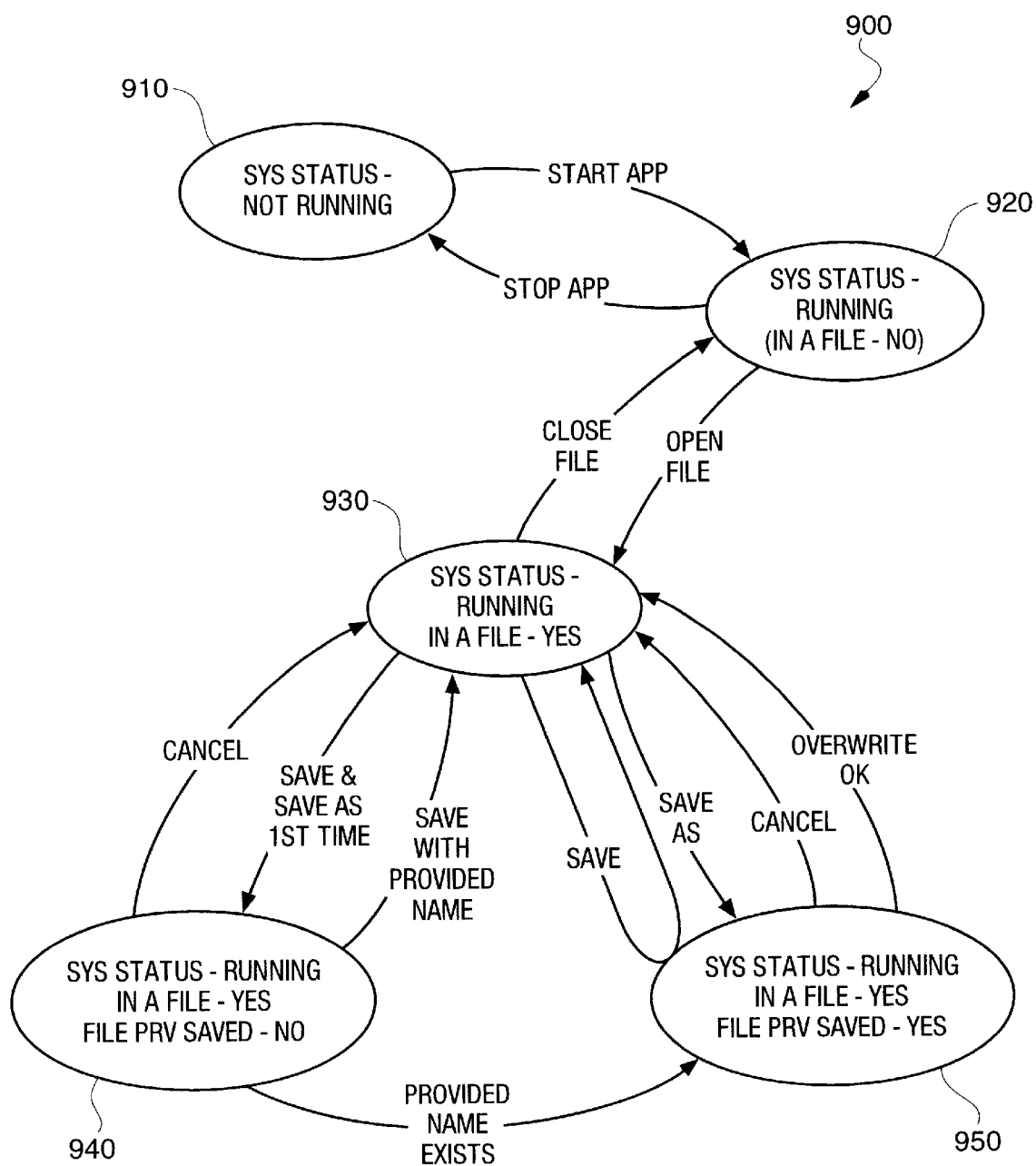
FIG. 9 illustrates a state diagram example for the state table of FIGS. 7 and 8 and FIG. 10 illustrates an overview of a state transition conflict reporting steps.

FIG. 6 illustrates an example of a user variable definition tree 600 used to identify user variables for use by the state table generating system. FIG. 7 illustrates an example of a state transition table 700 generated by the state table generating system for a small "Save/SaveAs" partition of the word processing target system. FIG. 8 illustrates the present state and available stimuli table corresponding to the state transition table of FIG. 7. FIG. 9 illustrates the state table information of FIGS. 7 and 8 in state diagram form.

The target system in the example below is a word processing UI, and in particular, the partition of the word processing UI that provides the feature for saving a file that is open for editing with full read/write privileges. Toward the end of generating a state table for the "Save/SaveAs" partition of the word processing UI, the present example will do so by way of defining usage variables as discussed in the text accompanying step 508 of FIG. 5.

FIG. 6 illustrates a usage variable tree 600 that can facilitate identifying usage variables that are needed by the state table generating system to properly map the file saving features of the word processing target system. The usage variable tree 600 identifies the usage variable root System Status 610 and the usage variable's values, including but not limited to, "Application Error Handling" 612, "Application Running" 615, and "Application Not Running" 618. The usage variable value combination System Status/Application Running 615, contains further usage variables including "In A Modal Dialog" 620 and "In A File" 630, each having further usage variable values 622, 625, 632–655 thereunder.

FIG. 7 illustrates a state transition table 700 that is generated as the state table generating system explores a word processing UI target system as previously disclosed in the operational steps 500. State transition table 700 includes a plurality of rows 720–731 each having entries in a Present State column 710, a Transition Stimulus column 711, and a New State column 712. Note that usage variables that include Help Tutorials and Error Handling have been eliminated from the following discussion to simplify the example. Also, because a state is defined by the combination of all usage variable values existing at that time, and because the total number of usage variables and their values even in this simple example can be in the 10's of numbers, only usage variables that are in-scope are listed in the Present State column 710 and New State column 712. Out-of-scope usage variables are ones whose values have no affect on a given state.

The first usage variable value calculation performed in the process of generating state transition table 700 is for the System Status 610 usage variable illustrated in FIG. 6. The usage variable values for the System Status 610 usage variable include Error Handling 612, Running 615, and Not Running 618. As illustrated in row 720, the only stimuli available from the present state defined by System Status—Not Running, is the Start Application Command. Selecting and applying the Start Application Command stimulus results in a state transition to a new state defined by System Status—Running.

As illustrated in row 721, one stimuli available from the present state defined by System Status—Running, is the Stop Application Command. Selecting and applying the Stop Application Command stimuli results in a state transition to a new state defined by System Status—Not Running. Because the state defined by System Status—Not Running and its available stimuli have already been recorded, no further processing from that state is necessary. However, a scan of the stimuli available from the System Status—Running state reveals that there are additional unselected stimuli available for selection and application. Thus, as illustrated in row 722, another stimuli available from the present state defined by System Status—Running; In A File—No, is the Open File Command. Selecting and applying the Open File Command stimuli results in a state transition to a new state defined by System Status—Running; In A File—Yes. The states and the transition therebetween are recorded in the table of known states accordingly.

As illustrated in row 723, one stimuli available from the present state defined by System Status—Running; In A File—Yes, is the Close File Command. Selecting and applying the Close File Command stimuli results in a state transition to a new state defined by System Status—Running; In A File—No. The states and the transition therebetween are recorded in the table of known states accordingly.

As illustrated in row 724, another stimuli available from the present state defined by System Status—Running; In A File—Yes, is the Save or Save As Commands. Selecting and applying either the Save or the Save As Command stimuli results in a state transition to a new state defined by System Status—Running; In A File—Yes; File Previously Saved—No. The states and the transition therebetween are recorded in the table of known states accordingly.

As illustrated in row 725, one stimuli available from the present state defined by System Status—Running; In A File—Yes; File Previously Saved—No, is the Cancel Command from the modal dialog resulting from saving a file for the first time. Selecting and applying the Cancel Command stimuli results in a state transition to a new state defined by System Status—Running; In A File—Yes, without having saved the file. The states and the transition therebetween are recorded in the table of known states accordingly.

As illustrated in row 726, another stimuli available from the present state defined by System Status—Running; In A File—Yes; File Previously Saved—No, is entering a unique file name in the modal dialog accompanying the action of saving a file for the first time. Selecting and applying the entering a unique file name stimuli results in a state transition to a new state defined by System Status—Running; In A File—Yes, with the subject file having been saved under the unique file name provided. The states and the transition therebetween are recorded in the table of known states accordingly.

As illustrated in row 727, another stimuli available from the present state defined by System Status—Running; In A File—Yes; File Previously Saved—No, is entering a non-unique file name in the modal dialog accompanying the action of saving a file for the first time. Selecting and applying the entering a non-unique file name stimuli results in a state transition to a new state defined by System Status—Running; In A File—Yes; File Previously Saved—Yes, with the subject file having been saved under the non-unique file name provided. The states and the transition therebetween are recorded in the table of known states accordingly.

As illustrated in row 728, one stimuli available from the present state defined by System Status—Running; In A File—Yes; File Previously Saved—Yes, is the Cancel Command in response to the "is it OK to save over an existing file" verification dialog. Selecting and applying the Cancel Command stimuli results in a state transition to a new state defined by System Status—Running; In A File—Yes, without having saved the subject file. The states and the transition therebetween are recorded in the table of known states accordingly.

As illustrated in row 729, another stimuli available from the present state defined by System Status—Running; In A File—Yes; File Previously Saved—Yes, is the Overwrite OK Command in response to the "is it OK to save over an existing file" verification dialog. Selecting and applying the Overwrite OK Command stimuli results in a state transition to a new state defined by System Status—Running; In A File—Yes, with the subject file having been saved. The states and the transition therebetween are recorded in the table of known states accordingly.

As illustrated in row 730, another stimuli available from the present state defined by System Status—Running; In A File—Yes, is the Save Command for the nth time where n>1. Selecting and applying the Save Command stimuli for the nth time where n>1, results in a state transition to a new state defined by System Status—Running; In A File—Yes; File Previously Saved—Yes, with the subject file having been saved. The states and the transition therebetween are recorded in the table of known states accordingly.

Figure 10:
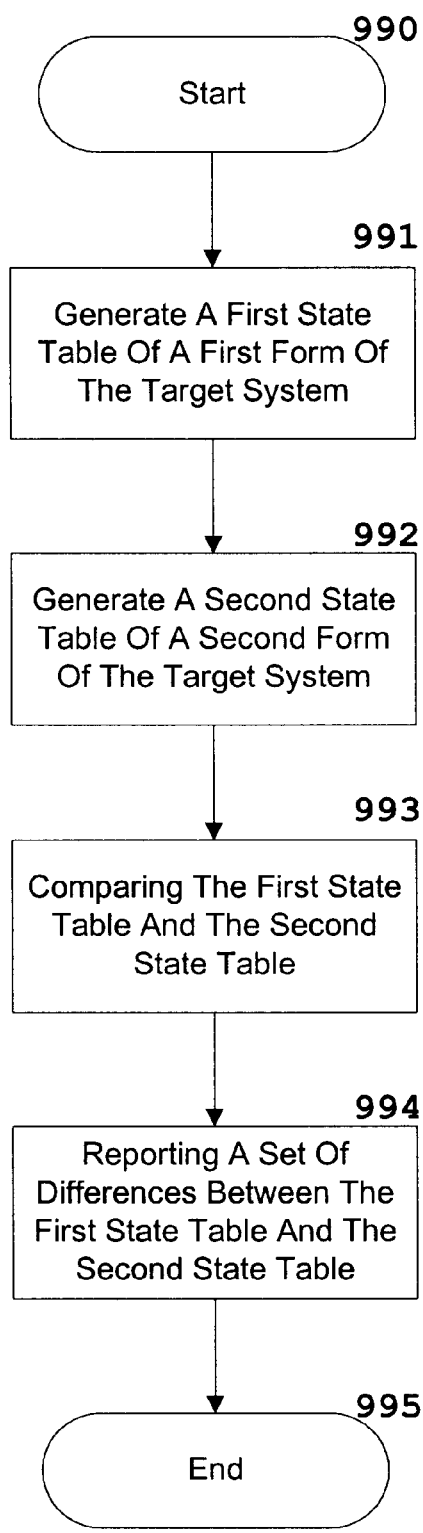

The invention, as shown in steps 990–995 of FIG. 10, further includes the steps of: generating a first state table of a first form of said target system (step 991); generating a second state table of a second form of said target system (step 992); comparing said first state table and said second state table (step 993); and reporting a set of differences between said first state table and said second state table (step 994).

As illustrated in row 731, another stimuli available from the present state defined by System Status—Running; In A File—Yes, is the Save As Command for the nth time with an existing file name for n>1. Selecting and applying the Save Command stimuli for the nth time with an existing file name for n>1, results in a state transition to a new state defined by System Status—Running; In A File—Yes; File Previously Saved—Yes, with the subject file having been saved. The states and the transition therebetween are recorded in the table of known states accordingly.

FIG. 8 illustrates an available stimulus table 800 in table form. The available stimulus table 800 includes a present state column 810 and an available stimulus column 811. Each row 820–824 of the available stimulus table 800 illustrates one of the five states discussed in the FIG. 7 example in the present state column 810 of each row 820–824 and the stimulus that is available from each given state in the available stimulus column 811 of each row 820–824. For example the present state illustrated in row 820 column 810 is System Status—Not Running, and the stimulus available from that present state in row 820 column 811 is the Start Application Command. Thus, when selecting an unselected stimuli from the present state at step 512 in FIG. 5, the only stimuli choice the first time the System Status—Not Running state offers is the Start Application Command stimuli. Similarly, the present state illustrated in row 821 column 810 is the System Status—Running, having two available stimuli listed in row 821 column 811. The remaining present states in rows 822–824 are listed with their respective available stimuli in accordance with the above example.

FIG. 9 more clearly illustrates the states and state transitions discussed in the text accompanying FIGS. 7–8, in state diagram 900 form. The state transitions between the various states in state diagram 900 are illustrated using a directed arrow to indicate the originating and terminating direction of the transition from a present state to a new state. The states illustrated in state diagram 900 include the System Status—Not Running state 910, System Status—Running state 920, System Status—Running; In A File—yes state 930, System Status—Running; In A File—yes; File Previously Saved—No state 940, and the System Status—Running; In A File—yes; File Previously Saved—Yes state 950. The state transitions between states 910, 920, 930, 940, and 950 are the same stimuli transitions represented by the row numbers 720–731 in state transition table 700 and the text accompanying FIG. 7.

State Table Generating System Uses

Among the uses of the state table generating system include, but are not limited to, generating state tables and/or state diagrams for the design and testing of hardware and software target systems. For example, during the design of either an individual circuit, an integrated circuit, or an entire circuit board, implementing the state logic of the hardware in software form provides an easy medium for the state table generating system to explore and map the hardware design prior to physically implementing the design. To test an already implemented hardware design requires a logic probe interface of any type well known in the art that provides an interface between the hardware and the state table generating system. The state table generating system explores the hardware via the logic probe interface by exploring the hardware design while providing the various inputs and monitoring outputs from the logic probe interface. Whether designing or testing hardware, portions of the target system that have been modified, for example, can be easily remapped by partitioning the modified portion of the modified target system and running the state table generating system on the new partition.

Statistical testing of a software target system can be achieved by using the state table generating system to map and verify that each state in the target system has been visited and each stimuli results in the expected state transition. Absent an automated tool such as the state table generating system, exhaustive statistical testing and/or partitioned re-testing of complex systems was beyond human ability and consistent repeatability. For similar reasons, thorough usability analysis and/or user interface complexity analysis are possible with the state table generating system.

Summary

The state table generating system explores a target system in real time to identify and record all operational states and state transitions within the target system. The operational states in the target system are defined by the combination of all usage variable values present at a given time during target system operation. Although specific embodiments are disclosed herein, it is expected that persons skilled in the art can and will design alternative state table generating systems that are within the scope of the following claims either literally or under the Doctrine of Equivalents.

What is claimed is:

1. A computer-readable medium containing computer-executable instructions for performing a method for generating a state table of a target system, the method comprising: defining a partition of the target system upon which the method for generating the state table operates; exploring the partition of the target system to identify states and state transitions therein, including manipulating the target system; and generating the state table based on at least a subset of the states and state transitions identified in the partition.

2. The computer-readable medium of claim 1, wherein the step of exploring includes: defining a usage variable for at least one component of the target system; and navigating the target system based on a state derived from the usage variable and a state transition from the state.

3. The computer-readable medium of claim 2, including computer-executable instructions for recording state transition conflict information when a state transition conflict is encountered.

4. The computer-readable medium of claim 2, including computer-executable instructions for prompting an operator for transition conflict resolution information when the state transition results in a state transition conflict; and navigating the transition conflict based on the state transition conflict resolution information.

5. The computer-readable medium of claim 2, including computer-executable instructions for implementing the target system with an internal system data accessibility method; extracting transition conflict resolving information from the target system by way of the internal system data accessibility method; and navigating a state transition conflict based on the transition conflict resolving information.

6. The computer-readable medium of claim 2, including computer-executable instructions for storing the state table in a non-volatile memory; and outputting the state table in at least one human readable form.

7. A computer-readable medium containing computer-executable instructions for performing a method for generating a state table of a target system, the method comprising: defining the target system in terms of at least one usage variable; determining a present state of the target system based on the at least one usage variable; scanning the present state to identify at least one stimuli for a state transition; applying the stimuli to the target system to precipitate the state transition from the present state to a next state in the target system; recording the present state, the next state, and the state transition in the state table.

8. The computer-readable medium of claim 7, including computer-executable instructions for defining a partition of the target system upon which the method for generating the state table operates.

9. The computer-readable medium of claim 7, including computer-executable instructions for recording state transition conflict information when a state transition conflict is encountered in the target system.

10. The computer-readable medium of claim 7, including computer-executable instructions for storing the state table in a non-volatile memory; and outputting the state table in at least one human readable form.

11. The computer-readable medium of claim 10, wherein the at least one human readable form includes generating the state table in a column and row format.

12. The computer-readable medium of claim 10, wherein the at least one human readable form includes generating the state table in a graphic format.

13. The computer-readable medium of claim 7, including computer-executable instructions for generating a first state table of the target system; generating a second state table of the target system; comparing the first state table and the second state table; and reporting a set of differences between the first state table and the second state table.

14. The computer-readable medium of claim 7, wherein the target system is a software application.

15. The computer-readable medium of claim 14, wherein the generated state table includes states and state transitions for at least a subset of an application program interface or user interface of the application program.

16. The computer-readable medium of claim 15, wherein the application program is a word processing application.

17. A computerized method for generating a state table of a target system, the computerized method comprising: defining the target system in terms of a plurality of usage variables; exploring the target system to identify states and state transitions therein based on unique combinations of the plurality of usage variables as states, including manipulating the target system; and generating the state table based on at least a subset of the states and state transitions identified in the target system.

18. The method of claim 17, wherein the step of exploring includes: determining a present state in the target system based on a combination of values for each of the plurality of usage variables; scanning the present state to identify at least one stimuli for a state transition; applying a previously unapplied one of the stimuli to precipitate the state transition from the present state to a next state; recording the present state, the next state, and the state transition therebetween in the state table.

19. The method of claim 18, including recording state transition conflict information when a state transition conflict is encountered in the target system.

20. The method of claim 18, including: storing the state table in a non-volatile memory; and outputting the state table in at least one human readable form.

21. The computer-readable medium of claim 17, wherein the target system is a software application.

22. The computer-readable medium of claim 21, wherein the generated state table includes states and state transitions for at least a subset of an application program interface or user interface of the application program.

23. The computer-readable medium of claim 22, wherein the application program is a word processing application.

24. A system for generating a state table of a target system, the system comprising: means for determining a present state in the target system based on a unique combination of values for each of a plurality of usage variables; means for selecting an unselected stimuli from the present state; means for applying the unselected stimuli to the target system in the present state to precipitate a state transition of the target system from the present state to a next state; means for scanning the next state for available stimuli; and means for recording the present state and the next state and the state transition therebetween in the state table.

25. The system of claim 24, including: means for repeating the system for generating a state table until each of the available stimuli for each state in the state table has been applied; and means for resolving a state transition conflict encountered.

26. The system of claim 24, including means for outputting the state table of known states in at least one human readable form.

* * * * *